Oct. 24, 1961 V. HOFMANN 3,005,917

TRANSISTOR COUNTING CIRCUIT HAVING RESISTOR AND DIODE INTERSTAGE COUPLING MEANS

Filed Nov. 28, 1958 3 Sheets-Sheet 1

Fig. I.

WITNESSES:
Bernard R. Gieguez
James F. Young

INVENTOR
Viktor Hofmann
BY R. Y. Brodahl
ATTORNEY

Oct. 24, 1961 V. HOFMANN 3,005,917

TRANSISTOR COUNTING CIRCUIT HAVING RESISTOR AND DIODE INTERSTAGE COUPLING MEANS

Filed Nov. 28, 1958 3 Sheets-Sheet 2

Oct. 24, 1961 V. HOFMANN 3,005,917

TRANSISTOR COUNTING CIRCUIT HAVING RESISTOR AND DIODE INTERSTAGE COUPLING MEANS

Filed Nov. 28, 1958 3 Sheets-Sheet 3

United States Patent Office 3,005,917

Patented Oct. 24, 1961

3,005,917

TRANSISTOR COUNTING CIRCUIT HAVING RESISTOR AND DIODE INTERSTAGE COUPLING MEANS

Viktor Hofmann, Erlangen, Germany, assignor to Siemens-Schuckertwerke Aktiengesellschaft, Erlangen, Germany, a corporation of Germany Filed Nov. 28, 1958, Ser. No. 777,041

Claims priority, application Germany Dec. 5, 1957

4 Claims. (Cl. 307—88.5)

Figure 1:
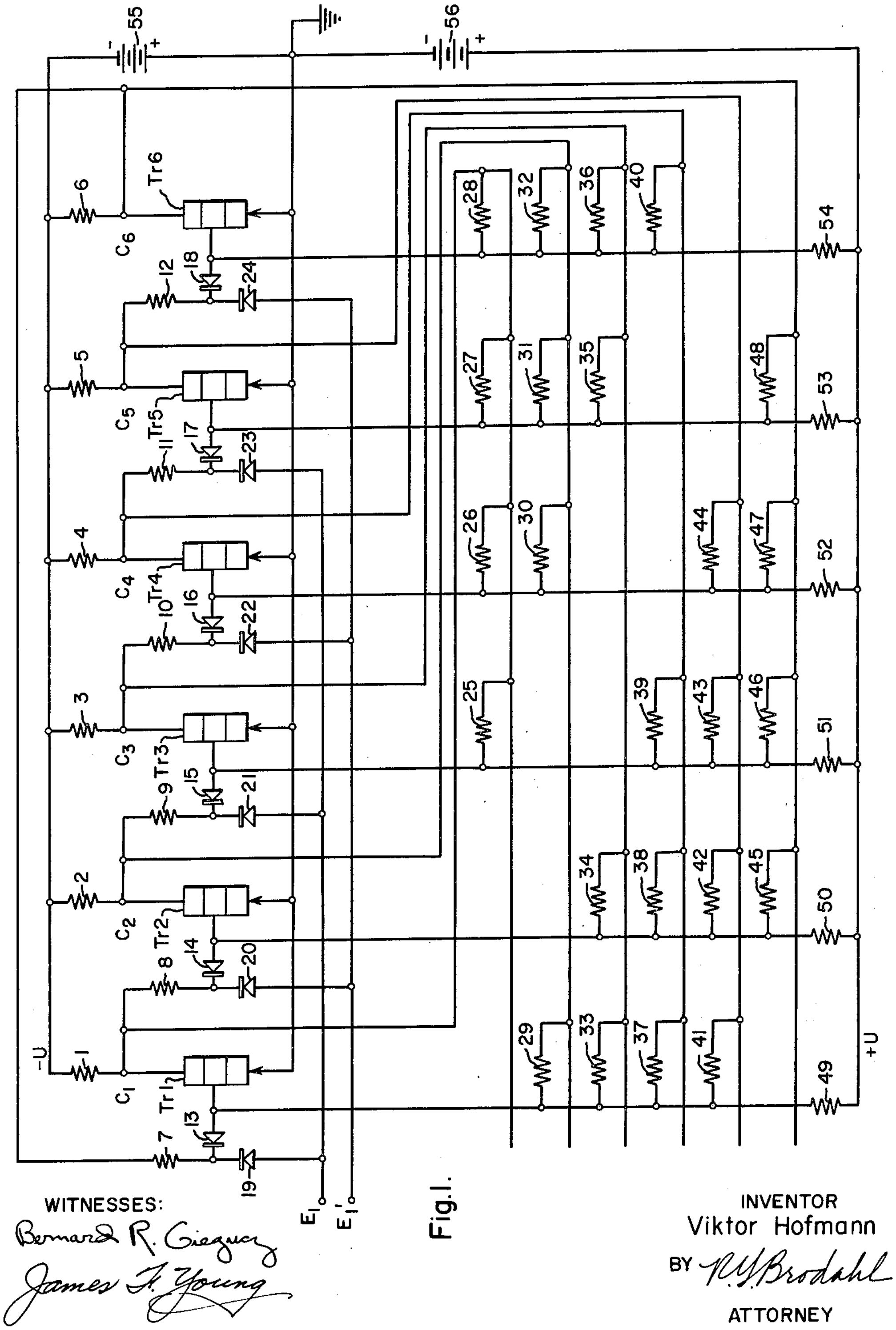

The invention relates to automatic control apparatus, and more particularly to a device which is adapted to count or control sequential operations. There are provided to control these operations pulsed signals or changes in electric voltages or currents which are impressed upon the subject control apparatus or counting device as control signals.

Heretofore, counting circuits have often been built up by using binary systems in combination with decade systems, and by then evaluating the binary numbers by translating them into the decade system numbers. Also known is the use of other intervals, such as octal or, particularly, quintal systems, with five counting steps, in which a subsequent evaluation or translation also takes place. The indivdual counting steps up to the next counting impulse are stored in electrical or electronic memory circuits, e.g., in bistable trigger circuits. In general, the trigger circuits for the individual stages representing counting steps are capacitively coupled with each other.

By using control label semiconductors, particularly transistors, which in themselves do not have the desired two stable operative states and the ability to change from one state to the other one, it has been necessary to use for each stage corresponding to a counting step two transistors or other controllable semiconductors. In order to permit the use of only one single transistor, a very complicated circuit arrangement would have been required and it would have been necessary to employ types of transistors which are not very suitable for this purpose on account of disadvantageous operating characteristics.

In the prior art counting circuits use is usually made, as mentioned above, of a capacitive coupling between the individual stages which correspond to counting steps. However, counting circuits with a capacitive coupling are immensely sensitive to spurious disturbance or interference impulses; on the other hand, a change to a galvanic coupling would require a great number of constructional elements and may, in certain circumstances, also present difficulties in the supply of the operating voltages for the individual stages.

It is an object of the present invention to provide a very simplified but reliable device consisting of less constructional elements, in which especially the number of controllable semiconductors may be reduced.

The invention resides in that in such a device, there is provided a single controllable semiconductor for each stage, associated with a counting step, of a decade or any other given interval, said semiconductor is galvanically coupled through suitable resistors and diodes to the controllable semiconductors of the other such stages so that only one single controllable semiconductor at a time will assume its one operative state, e.g., its blocked or nonconductive state, whereas all the other semiconductors are in the other state, e.g., the open or conductive state.

With the use of transistors as controllable semiconductors, each collector element may be connected through a resistor and a diode to the base element of the following transistor, and an additional coupling may be provided through a resistor with the base element terminals of all the other transistors.

Further features of the invention will now be explained with reference to the drawings, wherein the figures of which show, in a simplified schematic representation, embodiments of the present invention.

In FIGURE 1 there is a schematic showing of one embodiment of the signal counter apparatus in accordance with the present invention.

Figure 2:
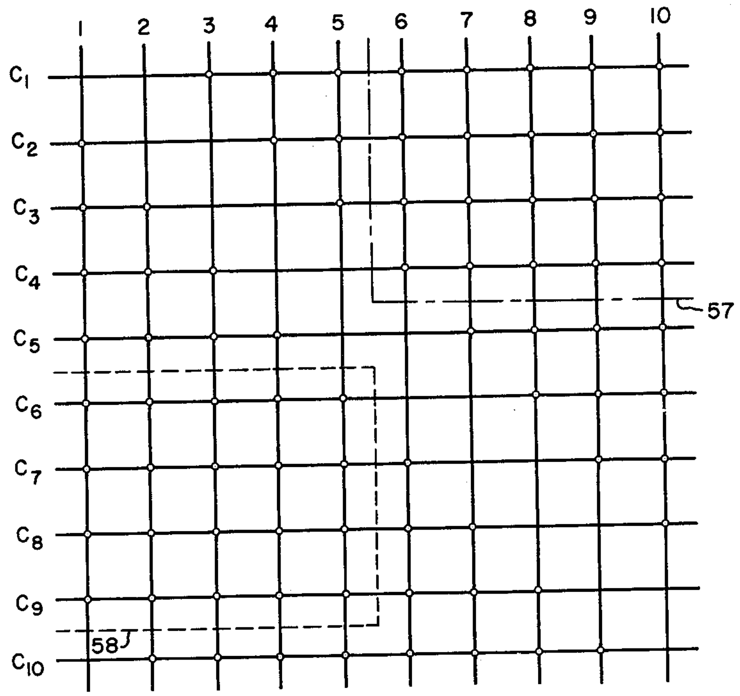

In FIGURE 2 there is shown a resistor connection diagram of the transistor collector element connections relative to the transistor base elements.

Figure 3:
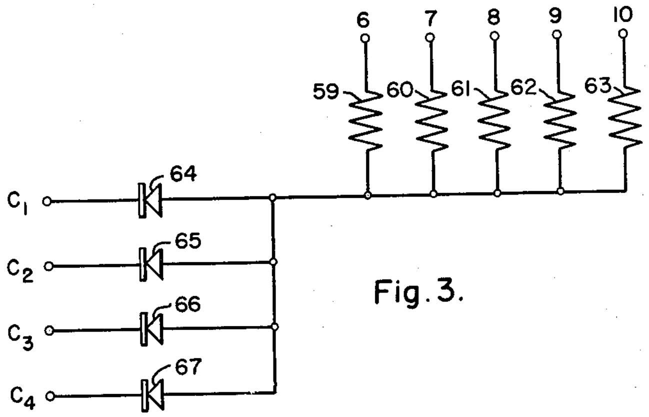

In FIGURE 3 there is a schematic showing of one modified form of the resistor connections between the collector elements of transistors $C_1$ to $C_4$ and the base elements of the transistors 6 to 10, as represented by the line 57 of FIGURE 2.

Figure 4:
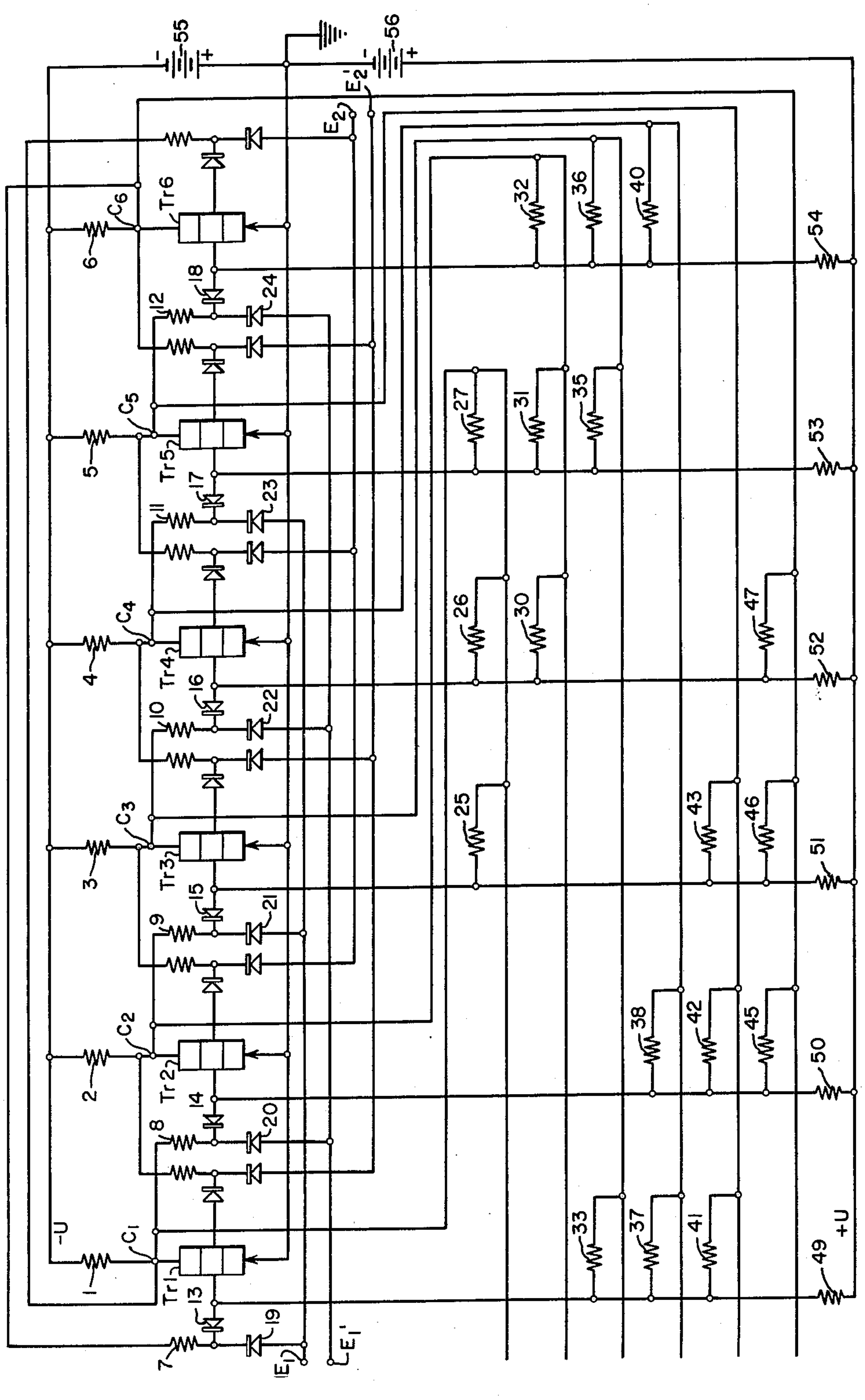

FIGURE 4 shows a modified form of the signal counter apparatus, wherein backward counting operations may be effected.

The embodiment illustrated in FIGURE 1 represents a counting circuit employing transistors, wherein for the sake of simplicity an interval of six signal counting stages is shown instead of a decade counter.

As mentioned before, a numerical system other than the decadic one may also be used. The last stage of the respective interval has similar switching elements, as are disposed between the individual stages, and is interconnected with the first stage so that a ring of completely identical stages is provided. In a decadic system, one proceeds from a certain decimal place to the next following decade counter so as to form the individual decimals.

In each individual stage, that is, for each counting step, there is provided only one single transistor. The characters $Tr_1$ to $Tr_6$ designate the individual transistors of the individual stages shown in FIGURE 1, said transistors preferably being junction transistors. The emitter element terminals of the six transistors are connected to a common ground potential. The collector elements, which are designated as $C_1$ to $C_6$ respectively corresponding to the transistors $Tr_1$ to $Tr_6$, are connected through resistors 1 to 6 to the negative potential of the voltage source 55. Each of the collector elements $C_1$ to $C_6$ is connected to the base element terminal of the succeeding transistor through a resistor and a diode, said resistors being designated 7 to 12 and said diodes being designated 13 to 18, respectively. At the same time there is provided a connection from each collector element terminal to the base element terminals of all other transistors through a network of resistances including resistor members 25 through 54. It is important that such connection does not lead to the transistor following in the counting direction. Thus, a resistor 25 is connected, for example, between the collector element $C_1$ and the base element terminal of transistor $Tr_3$. In order to make the circuit diagram clearer, the individual connections of the latter coupling resistors with the associated collector terminals have been omitted, and the conductors connected to the respective resistors have been designated $C_1$ to $C_5$; that means these conductors must be regarded as being connected to the corresponding collector elements $C_1$ to $C_5$ of the circuit. Hence, such resistor connection leads from the collector $C_1$ of the transistor $Tr_1$ to the base terminal of each other transistor except the succeeding one; and in a similar manner, coupling resistor 26 is connected to transistor $Tr_4$, a coupling resistor 27 to $Tr_5$ and a coupling resistor 28 to $Tr_6$.

Also in connection with the resistors 7 to 12 are the respective diodes 19 to 24 which, together with the resistors have an operative effect similar to a so-called AND gate. The diodes 19, 21 and 23 are connected to the input circuit $E_1$, and the diodes 20, 22 and 24 are connected to the input $E_1'$. The high ohmic resistances 49 to 52 serve only for a cut-off current compensation or for the compensation of reverse currents, respectively.

The circuit arrangement makes it posisble that only one single transistor at a time can be in a blocked or non-conductive state, for its collector element will then have a negative potential so that all other coupled transistors will receive control currents through the coupling resistors between their base terminals and the collector of the blocked transistor, and will therefore, be conductive.

It is further possible, by a suitable modification of the circuit, to cause one single transistor to operate in the saturation and conductive region, whereas all other transistors are in a non-conductive state.

For a description of the mode of operation of the circuit ararngement it is assumed that initially the transistor $Tr_1$ is non-conductive, and all other transistors are, therefore, saturated or conductive, and that the input $E_1$ of the two inputs $E_1$ and $E_1'$ has no voltage thereacross, such that it carries a ground potential. Since also the emitter element terminals have a ground potential, this would mean that input $E_1$ carries the emitter element potential. It is further assumed that the other input, namely $E_1'$, receives, or just has received, a negative signal from a trigger circuit or a switching device in the input circuit. By now changing the control voltage, that is, by causing $E_1'$ to have a ground potential and $E_1$ to have a negative voltage, the transistor $Tr_2$ will be caused at this moment to assume its blocking or non-conductive state, and its base element will receive a ground potential through the diode 20 so that no control current will flow through the diode 14 any longer. The diodes 13 to 18 have a greater threshold value than the diodes 19 to 24 so that a ground potential will then, in fact, be obtained at the base element of the transistor $Tr_2$.

As soon as the transistor $Tr_2$ blocks, and therefore the voltage drop across the collector resistance 2 becomes lower, the collector element $C_2$ will become negative and a control current will flow through the resistors 9 and 29, 30, 31 and 32. Consequently, the transistor $Tr_1$ will become conductive, and the transistors $Tr_3$, $Tr_4$, $Tr_5$ and $Tr_6$ will still remain in a conductive state. Upon the next change of the signal at $E_1$ and $E_1'$, the transistor $Tr_3$ will be blocked and $Tr_2$ will again become conductive. Thus, a stepping operation is effected upon each change of the input signal, and the outputs at the collector elements $C_1$ to $C_6$ successively have signal voltage thereacross. The transistor $Tr_6$ is followed by transistor $Tr_1$, corresponding to the ring coupling, so that the transistor $Tr_1$ will become blocked or non-conductive after the blocking of the transistor $Tr_6$.

The illustrated circuit arrangement preferably can be designed with ten stages as a decade counter. If desired, however, there may also be provided twenty or more counting steps or stages. The use of more than ten steps, however, may require an objectionably great number of coupling resistors. However, it is possible, by further modifying the invention, to effect a substantial saving of coupling elements, as will hereinafter be described with particular reference to FIG. 2.

FIG. 2 represents a "resistance field" (resistor diagram) for a decade forming a lattice which symbolizes the connections to the individual transistor collector elements $C_1$ to $C_{10}$ for a ten stage counter on the one hand, and the connections 1 to 10 to the base elements of the transistors 1 to 10 on the other hand. As shown by FIGURE 2, a resistor connection exists from the collector elements $C_1$ to $C_4$ to the base elements of the transistors 6 to 10, as indicated by the chain line 57. Likewise, a resistor connection exists from the collector elements $C_6$ to $C_9$ to the base elements of transistors 1 to 5 within the space circumscribed by the broken line 58. These two networks consisting of 20 resistors each may be replaced by circuits each comprising four diodes and five resistors. An embodiment illustrating this feature is illustrated in FIG. 3. Shown connected to the base elements of the transistors 6 to 10 are resistors 59 to 63 which are also connected through diodes 64 to 67 to the collector elements $C_1$ to $C_4$. This combination is particularly suitable for higher numbers of counting stages or steps for which the circuit is designed. For example, if provision is made for 20 steps, two networks each comprising 90 resistors may be replaced by ten diodes and nine resistors each. In this arrangement, an intermediate transistor may also be included for amplification purposes, if desired.

If the resistors 29, 34, 39, 44 and 48 (FIG. 1) are combined with input diodes in a similar manner as the resistor 7 is combined with the diodes 19 and 13, the same circuit can be used for backward counts by applying the input signals to the inputs associated with said diodes. FIG. 4 shows an embodiment in which this can be done, wherein the connections indicated by broken lines are employed for backward-counting operations, which connections lead to the inputs $E_2$ and $E_2'$. Therein, in addition to the connections through a resistor and a diode from the collector element of each transistor to the base element of the following transistor, there are provided similar connections to the base element of the preceding transistor. In this manner, the same conditions are obtained for backward counts, whereby the cycle is stepped in a corresponding manner from any desired transistor to the preceding transistor.

It may often be desired to cause the circuit to assume a certain rest position upon the application of the operating voltage, that is, to insure that no other transistor will determine the starting position from time to time. For example, it may be desired to maintain the transistor $Tr_1$ in its blocked state so that upon operation of the device or after any accidental or inadvertent momentary interruptions of the operation, the device will always restart from the same initial position. So far as the operating voltage, upon initiation (of the operation), involves a slow current rise due to the smoothing means included in the power unit, the desired condition can be readily obtained by connecting a threshold rectifier into the base circuit of the transistor $Tr_1$.

The counting circuit embodying the invention may also be used in multi-contact control systems. In that case, the diodes 19 to 24 are not connected in common to the respective inputs $E_1$ and $E_1'$ but are connected each to an end control switch such that, upon operation of said switch, the particular diode will be at ground potential through a low ohmic resistance. In this case, the diodes 19 to 24 (FIG. 1) may readily be omitted. The counting stage may then be stepped only by means of the end switch which leads to the input of the transistor succeeding the transistor which at the moment is in a blocked state. An operation of all the other end switches would have no effect, that is, provision is made at the same time for a mutual interlocking of the end switches.

I claim as my invention:

1. In a device for counting applied control signals, a plurality of counting stages, each stage including one controllable semiconductor having a conductive state of operation and a non-conductive state of operation and which is galvanically coupled to the controllable semiconductors respectively of the other stages, with each semiconductor having at least first and second control elements, said first element of each semiconductor being coupled through a resistance member to the second element of each other semiconductor except the next successive semiconductor such that only one controllable semiconductor of said counting device at a time will assume said non-conductive stage of operation and all the remaining semiconductors are in the conductive state of operation, and further with each first element being connected through a resistor and a diode to the second element of the transistor following in the counting direction.

2. In a device for counting applied control signals, a plurality of counting stages, each stage including one controllable semiconductor having a conductive state of operation and a non-conductive state of operation and which is galvanically coupled to the controllable semiconductors respectively of the other stages such that only one controllable semiconductor of said counting device at a time will assume said non-conductive stage of operation and all the remaining semiconductors are in the conductive state of operation, each of said semiconductors including at least a base element and a collector element, with each collector element being connected through a resistor and a diode to the base element of the transistor following in the counting direction, and with each collector element being further coupled through at least one resistance member to the base elements of all semiconductors except the succeeding one in the counting direction.

3. In a device for counting applied control signals, a plurality of counting stages, each stage including one controllable semiconductor having a conductive state of operation and a non-conductive state of operation and which is galvanically coupled to the controllable semiconductors respectively of the other stages such that only one controllable semi-conductor of said counting device at a time will assume said non-conductive stage of operation and all the remaining semiconductors are in the conductive state of operation, each of said semiconductors including at least a base element and a collector element, with each collector element being connected through a resistor and a diode to the base element of the transistor following in the counting direction, and first and second control-signal lines, said first line being connected to the base elements of the respective even-numbered counting stages, and each second line being connected to the base elements of the respective odd-numbered counting stages.

4. In a device for counting applied control signals, a plurality of counting stages, each stage including one controllable semiconductor having a conductive state of operation and a non-conductive state of operation and which is galvanically coupled to the controllable semiconductors respectively of the other stages such that only one controllable semi-conductor of said counting device at a time will assume said non-conductive stage of operation and all the remaining semiconductors are in the conductive state of operation, each of said semiconductors including at least a base element and a collector element, with each collector element being connected through a resistor and a diode to the base element of the transistor following in the counting direction, and first and second control-signal lines, said first line being connected to the base elements of the respective even-numbered counting stages, and each second line being connected to the base elements of the respective odd-numbered counting stages, and third and fourth control lines, said third line being connected to the base elements of the respective even-numbered counting stages and said fourth line being connected to the base elements of the respective odd-numbered counting stages, and a resistor member connected between the respective base element of each counting stage to the collector element of the next succeeding stage, such that said counting device may be operated in either one of a forward and a backward counting direction.

References Cited in the file of this patent

UNITED STATES PATENTS

| | | |
|---|---|---|
| 2,838,664 | Wolfendale | June 10, 1958 |
| 2,864,962 | Jensen | Dec. 16, 1958 |

FOREIGN PATENTS

| | | |
|---|---|---|
| 794,040 | Great Britain | Apr. 30, 1958 |